US006825675B1

(12) United States Patent
Robbins

(10) Patent No.: US 6,825,675 B1
(45) Date of Patent: Nov. 30, 2004

(54) METHOD FOR DETECTING A SHORTED PRINTHEAD IN A PRINTER HAVING AT LEAST TWO PRINTHEADS

(75) Inventor: Ricky E. Robbins, Harrodsburg, KY (US)

(73) Assignee: Lexmark International, Inc., Lexington, KY (US)

( * ) Notice: Subject to any disclaimer, the term of this patent is extended or adjusted under 35 U.S.C. 154(b) by 13 days.

(21) Appl. No.: 10/609,271

(22) Filed: Jun. 27, 2003

(51) Int. Cl.[7] .......................... G01R 27/26; B41J 29/38; B41J 29/393

(52) U.S. Cl. ............................ 324/678; 347/14; 347/19

(58) Field of Search ................................ 324/676–678, 324/601, 711, 510, 511; 347/14, 19, 20, 22, 23; 400/124.08, 124.02

(56) References Cited

U.S. PATENT DOCUMENTS

| | | | | |
|---|---|---|---|---|
| 4,119,973 | A | | 10/1978 | Stager |
| 4,484,199 | A | | 11/1984 | Watanabe |
| 4,595,935 | A | | 6/1986 | Brooks et al. |
| 4,853,718 | A | * | 8/1989 | ElHatem et al. ............... 347/7 |
| 4,996,487 | A | | 2/1991 | McSparran et al. |
| 5,422,664 | A | | 6/1995 | Stephany |
| 5,469,068 | A | | 11/1995 | Katsuma |
| 5,500,657 | A | | 3/1996 | Yauchi et al. |
| 5,572,241 | A | | 11/1996 | Kanayama et al. |
| 5,608,333 | A | | 3/1997 | Hayashi |
| 5,698,987 | A | | 12/1997 | Hayashi |
| 5,789,934 | A | | 8/1998 | Kolkowski et al. |
| 5,844,581 | A | | 12/1998 | DeJoseph et al. |
| 5,852,369 | A | | 12/1998 | Katsuma |
| 6,183,056 | B1 | | 2/2001 | Corrigan et al. |
| 6,199,969 | B1 | | 3/2001 | Haflinger et al. |
| 6,264,302 | B1 | | 7/2001 | Imanaka et al. |
| 6,299,269 | B1 | * | 10/2001 | Davies et al. .................. 347/2 |
| 6,462,433 | B1 | | 10/2002 | Nitta et al. |
| 6,481,814 | B2 | | 11/2002 | DeMoor et al. |
| 6,513,901 | B1 | | 2/2003 | Walker |
| 6,531,883 | B2 | | 3/2003 | Hayashi |
| 6,758,547 | B2 | * | 7/2004 | Ahne et al. ................... 347/19 |
| 2001/0038396 | A1 | | 11/2001 | Imanaka et al. |

* cited by examiner

*Primary Examiner*—Jay Patidar
*Assistant Examiner*—Jeff Natalini
(74) *Attorney, Agent, or Firm*—Douglas Erickson

(57) ABSTRACT

A calibration resistor and a capacitance load are placed in parallel across the output of a voltage source and a first decay time is determined for the voltage to reach a second voltage from a first voltage after the voltage source is disconnected. With the calibration resistor electrically removed, N printheads of a printer and the capacitance load are placed in parallel across the voltage source output. In a first example, the voltage across the capacitance load at a second decay time, which is shorter than the first decay time, is determined and indicates at least one possibly shorted printhead when less than the second voltage. In a second example, the voltage across the capacitance load at the first decay time is determined and indicates at least one possibly shorted printhead when less than a third voltage which is less than the second voltage.

20 Claims, 2 Drawing Sheets

METHOD FOR DETECTING A SHORTED PRINTHEAD IN A PRINTER HAVING AT LEAST TWO PRINTHEADS

TECHNICAL FIELD

The present invention relates generally to printing, and more particularly to a method for detecting a shorted printhead in a printer having at least two printheads.

BACKGROUND OF THE INVENTION

Printers include, without limitation, computer printers, copiers, and facsimile machines. Some printers, such as inkjet printers, print by printing closely-spaced ink dots on a print medium such as paper. Conventional inkjet printers include those having a carrier with two (or more) printheads such as a color printhead and a mono or a photo printhead. Typically, a color printhead prints cyan, magenta and yellow dots, a mono printhead prints black dots, and a photo printhead prints black, cyan and magenta dots. In one known design, the two (or more) printheads are coupled in parallel to the output of a voltage source such as the output of a printhead regulator (power adapter) to which a capacitance load has also been coupled in parallel. In normal operation, the regulator keeps the capacitor charged, and the printheads pull energy from the capacitor. A perfect printhead would have an infinite electrical resistance, and hence have no leakage current in a quiescent state. Actual printheads experience some leakage current in a quiescent state. A predetermined maximum leakage current is determined which indicates that the printhead is a shorted printhead and should be replaced.

Conventional methods for detecting a shorted printhead in a two printhead inkjet printer include detecting the current on the ground-return of the power adaptor and indicating a shorted printhead when the leakage current exceeds the predetermined maximum leakage current for a printhead. However, this method can indicate there is a shorted printhead in the two printhead inkjet printer when individual testing of each printhead would indicate each printhead is not a shorted printhead because the quiescent resistance of two printheads in parallel is less than the quiescent resistance of one printhead with the other printhead removed from the printer. This method can lead to confusion and cause a user to discard two good printheads or discard a good printhead and keep a shorted printhead.

What is needed is an improved method for detecting a shorted printhead in a printer having at least two printheads.

SUMMARY OF THE INVENTION

One method of the invention is for detecting at least one possibly shorted printhead in a printer having N printheads in parallel which are supplied a voltage from the output of a voltage source. This method includes steps a) through g). Step a) includes obtaining a calibration resistor having a resistance which, when placed in parallel to the voltage source, is equivalent to a predetermined maximum leakage current of a single non-shorted printhead in a quiescent state. Step b) includes placing the calibration resistor and a capacitance load in parallel across the output of the voltage source to define a first circuit. Step c) includes, with the N printheads electrically isolated from the first circuit, determining a first decay time for the first-circuit voltage across the capacitance load to reach a second voltage from a first voltage after the voltage source is disconnected from the first circuit. Step d) includes determining a second decay time which is shorter than the first decay time. Step e) includes placing the N printheads and the capacitance load in parallel across the output of the voltage source to define a second circuit. Step f) includes, with the calibration resistor electrically isolated from the second circuit and with the N printheads in a quiescent state, determining the second-circuit voltage across the capacitance load at the second decay time after the voltage source is disconnected from the second circuit. Step g) includes indicating at least one possibly shorted printhead of the N printheads when the second-circuit voltage at the second decay time is less than the second voltage. In one extension of this method, if step g) indicated at least one possibly shorted printhead, there are also included the steps of testing one printhead at a time with the other printheads removed from the printer and indicating that the one printhead is a shorted printhead if the voltage at the first decay time is less than the second voltage.

Another method of the invention is for detecting at least one possibly shorted printhead in a printer having N printheads in parallel which are supplied a voltage from the output of a voltage source. This method includes steps a) through g). Step a) includes obtaining a calibration resistor having a resistance which, when placed in parallel to the voltage source, is equivalent to a predetermined maximum leakage current of a single non-shorted printhead in a quiescent state. Step b) includes placing the calibration resistor and a capacitance load in parallel across the output of the voltage source to define a first circuit. Step c) includes, with the N printheads electrically isolated from the first circuit, determining a first decay time for the first-circuit voltage across the capacitance load to reach a second voltage from a first voltage after the voltage source is disconnected from the first circuit. Step d) includes determining a third voltage which is less than the second voltage. Step e) includes placing the N printheads and the capacitance load in parallel across the output of the voltage source to define a second circuit. Step f) includes, with the calibration resistor electrically isolated from the second circuit and with the N printheads in a quiescent state, determining the second-circuit voltage across the capacitance load at the first decay time after the voltage source is disconnected from the second circuit. Step g) includes indicating at least one possibly shorted printhead of the N printheads when the second-circuit voltage at the first decay time is less than the third voltage. In one extension of this method, if step g) indicated at least one possibly shorted printhead, there are also included the steps of testing one printhead at a time with the other printheads removed from the printer and indicating that the one printhead is a shorted printhead if the voltage at the first decay time is less than the second voltage.

Several benefits and advantages are derived from one or more of the methods of the invention. Using, with the same RC circuit decay voltage limit, a shorter decay time when testing two printheads than when testing one printhead or using, with the same RC circuit decay time, a lower decay voltage limit when testing two printheads than when testing one printhead allows the detection of at least one possibly shorted printhead with fewer false short indications than using conventional two printhead short detection methods.

DETAILED DESCRIPTION

Figure 1:
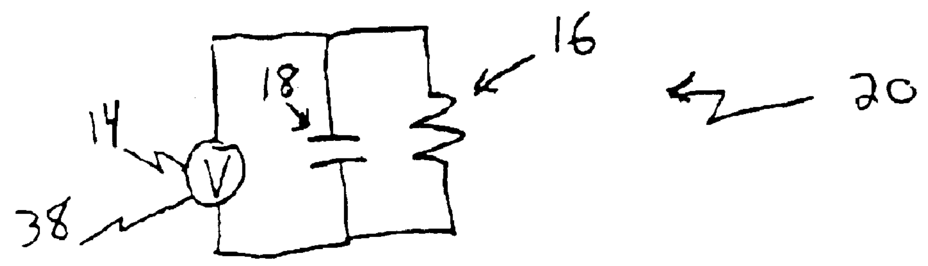
FIG. 1 is a circuit diagram of a first circuit, including a calibration resistor, used in a first method of the invention.
Figure 2:
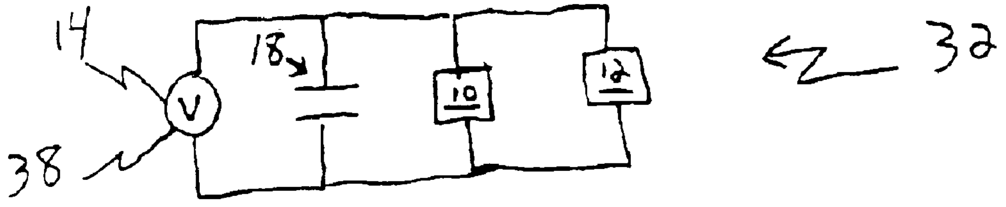
FIG. 2 is a circuit diagram of a second circuit, including first and second printheads, used in the first method.
Figure 3:
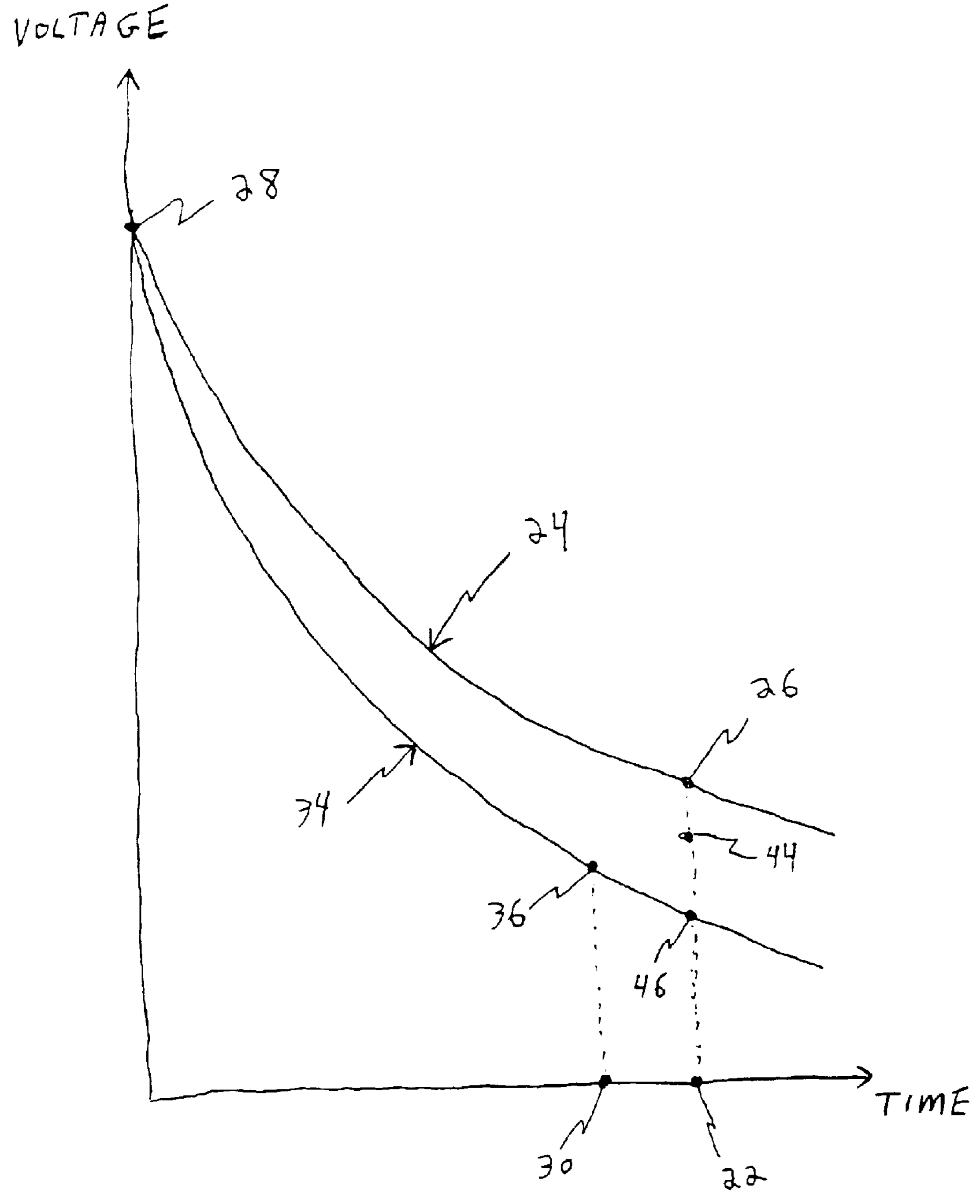
FIG. 3 is a voltage-time graph of the RC decay voltage corresponding to the circuits of FIGS. 1 and 2.

Referring to FIGS. 1–3, a first method of the invention is for detecting at least one possibly shorted printhead in a printer having first and second printheads 10 and 12 in parallel which are supplied a voltage from the output of a voltage source 14. The first method includes steps a) through g). Step a) includes obtaining a calibration resistor 16 having a resistance which, when placed in parallel to the voltage source, is equivalent to a predetermined maximum leakage current of a single non-shorted printhead in a quiescent state. It is noted that a printhead in a quiescent state is an inactive printhead having no activated printhead components. Step b) includes disposing the calibration resistor 16 and a capacitance load 18 in parallel across the output of the voltage source 14 to define a first circuit 20 (as seen in FIG. 1). Step c) includes, with the first and second printheads 10 and 12 electrically isolated from the first circuit 20, determining a first-circuit decay time 22 for the first-circuit voltage 24 across the capacitance load 18 to reach a second voltage 26 from a first voltage 28 after the voltage source 14 is disconnected from the first circuit 20 (as illustrated in FIG. 3). Examples of being "electrically isolated from" include, without limitation, being physically removed from and being disconnected from through an open switch. Step d) includes determining a second decay time 30 which is shorter than the first decay time 22. Step e) includes disposing the first and second printheads 10 and 12 and the capacitance load 18 in parallel across the output of the voltage source 14 to define a second circuit 32 (as seen in FIG. 2). Step f) includes, with the calibration resistor 16 electrically isolated from the second circuit 32 and with the first and second printheads 10 and 12 in a quiescent state, determining the second-circuit voltage 34 across the capacitance load 18 at the second decay time 30 after the voltage source 14 is disconnected from the second circuit 32. Step g) includes indicating at least one possibly shorted printhead of the first and second printheads 10 and 12 when the second-circuit voltage 34 at the second decay time 30 is less than the second voltage 26 (as indicated in FIG. 3 wherein point 36 is the second-circuit voltage 34 at the second decay time 30 which is seen to be less than the second voltage 26). Examples of being "electrically isolated from" include, without limitation, being physically removed from and being disconnected from through an open switch.

In one application of the first method, steps b) and c) are empirically performed (with the voltage source charging up the capacitance load and then being disconnected, and with the voltage across the capacitance load then being monitored as it decays), and in another application, they are mathematically performed from the known RC voltage decay equation, as is within the ordinary capabilities of those skilled in the art. It is noted that in one construction, not shown, a generalized circuit comprises the capacitance load, the calibration resistor, and the first and second printheads coupled in parallel to the output of the voltage source, wherein the disposing and electrical isolation in steps b) and c) are accomplished by physically removing the first and second printheads from the generalized circuit to define the first circuit, and wherein the disposing and electrical isolation in steps e) and f) are accomplished by disconnecting the calibration resistor from the generalized circuit using a switch to define the second circuit. In one enablement of the first method, the second decay time 30 is determined to be equal to the decay time for the first circuit voltage 24 to reach the second voltage 26 when the calibration resistor 16 in the first circuit 20 is replaced by a resistor (not shown) having an equivalent resistance to the resistance of two calibration resistors 16 connected in parallel. The second decay time can be empirically and/or mathematically determined, as is within the ordinary level of skill of the artisan. In one example, an ADC (analog-to-digital converter), not shown, is used to measure voltages.

In one embodiment, the first voltage is 10.8 volts dc (which is the printhead voltage for the printer), the calibration resistor 16 provides a known load of 150 milliamps, and the capacitance load is 440 microfarads. In one enablement of the first method, the second decay time 30 is determined to be in a range extending from 70% to 90% of the first decay time. It is noted that some shorted printheads would be called good using a percentage below 70% and that some good printheads would be called shorted using a percentage above 90%. In other enablements, percentages below 70% and above 90% are used which provide some benefit. In one variation, the second decay time is determined to be 80%, plus or minus 2%, of the first decay time. In one construction, the voltage source 14 is a printhead regulator 38.

Figure 4:
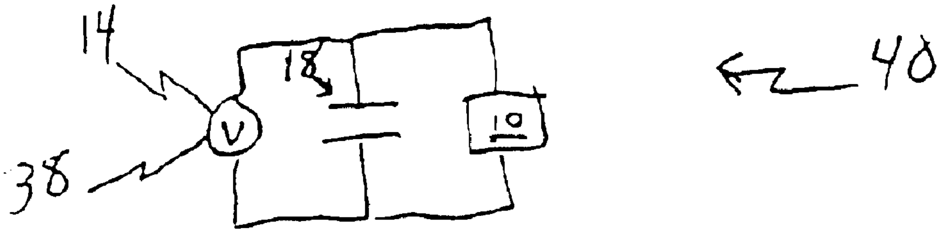
FIG. 4 is a circuit diagram, as in FIG. 2 but without the second printhead, used in an extension of the first method.

One extension of the first method, which also is for detecting when the first printhead 10 is a shorted printhead, also includes, when step g) indicates at least one possibly shorted printhead, steps h) through j). Step h) includes disposing the first printhead 10 and the capacitance load 18 in parallel across the output of the voltage source 14 to define a third circuit 40 (as seen in FIG. 4). Step i) includes, with the calibration resistor 16 and the second printhead 12 electrically isolated from the third circuit 40 and with the first printhead 10 in a quiescent state, determining the third-circuit voltage (not shown) across the capacitance load 18 at the first decay time 22 after the voltage source 14 is disconnected from the third circuit 40. Step j) includes indicating that the first printhead 10 is a shorted printhead when the third-circuit voltage at the first decay time 22 is less than the second voltage 26.

Figure 5:
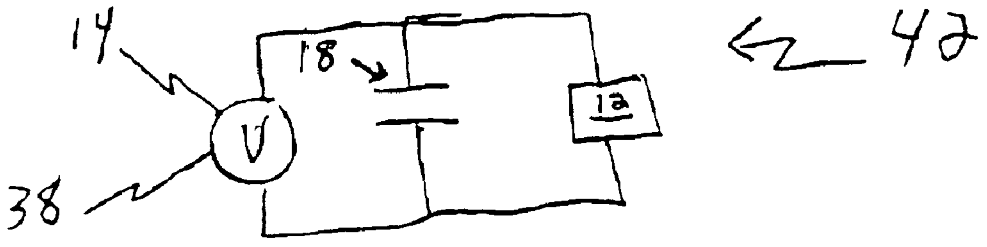
FIG. 5 is a circuit diagram, as in FIG. 2 but without the first printhead, used in an extension of the first method.

One modification of the one extension, which also is for detecting when the second printhead 12 is a shorted printhead, also includes steps k) through m). Step k) includes disposing the second printhead 12 and the capacitance load 18 in parallel across the output of the voltage source 14 to define a fourth circuit 42 (as seen in FIG. 5). Step l) includes, with the calibration resistor 16 and the first printhead 10 electrically isolated from the fourth circuit 42 and with the second printhead 12 in a quiescent state, determining the fourth-circuit voltage (not shown) across the capacitance load 18 at the first decay time 22 after the voltage source 14 is disconnected from the fourth circuit. Step m) includes indicating that the second printhead 12 is a shorted printhead when the fourth-circuit voltage at the first decay time 22 is less than the second voltage 26.

In one employment of the first method, the second voltage 26 is equal to substantially 36.7% of the first voltage 28. This is equivalent to having the first decay time equal one tau (one time constant), which is the product of the calibration resistor 16 times the capacitance load 18, as can be appreciated by those skilled in the art. In one arrangement employing the first method, the printer is an inkjet printer, and the first and second printheads 10 and 12 are inkjet printheads. As can be appreciated by the artisan, the first method can be generalized to a method for detecting at least one possibly shorted printhead in a printer having N printheads. In the generalized method, the expression "N printheads" replaces the expression "first and second printheads" in the previously described steps c) and e) through f).

Referring again to FIGS. 1–3, a second method of the invention is for detecting at least one possibly shorted printhead in a printer having first and second printheads 10 and 12 in parallel which are supplied a voltage from the output of a voltage source 14. The method includes steps a) though g). Steps a) through c) of the second method are identical to previously-described steps a) through c) of the first method. Step d) includes determining a third voltage 44 (indicated by point 44 in FIG. 3) which is less than the second voltage 26. Step e) of the second method is identical to previously-described step e) of the first method. Step f) includes, with the calibration resistor 16 electrically isolated from the second circuit 32 and with the first and second printheads 10 and 12 in a quiescent state, determining the second-circuit voltage 34 across the capacitance load 18 at the first decay time 22 after the voltage source 14 is disconnected from the second circuit 32. Step g) includes indicating at least one possibly shorted printhead of the first and second printheads 10 and 12 when the second-circuit voltage 34 at the first decay time 22 is less than the third voltage 44 (as indicated in FIG. 3 wherein point 46 is the second-circuit voltage 34 at the first decay time 22 which is seen to be less than the third voltage 44).

In one enablement of the second method, the third voltage 44 is determined to be equal to the first circuit voltage 24 at the first decay time 22 when the calibration resistor 16 in the first circuit 20 is replaced by a resistor (not shown) having an equivalent resistance to the resistance of two calibration resistors 16 connected in parallel.

In one embodiment, the first voltage is 10.8 volts dc (which is the printhead voltage for the printer), the calibration resistor 16 provides a known load of 150 milliamps, and the capacitance load is 440 microfarads. In one enablement of the second method, the third voltage 44 is determined to be in a range extending from 70% to 90% of the second voltage 26. It is noted that some shorted printheads would called good using a percentage below 70% and that some good printheads would be called shorted using a percentage above 90%. In other enablements, percentages below 70% and above 90% are used which provide some benefit. In one variation, the third voltage 44 is determined to be 80%, plus or minus 2%, of the second voltage 26.

The other previously-discussed aspects of the first method, and extensions thereof, are equally applicable to the second method, as can be appreciated by the artisan.

Several benefits and advantages are derived from one or more of the methods of the invention. Using, with the same RC circuit decay voltage limit, a shorter decay time when testing two printheads than when testing one printhead or using, with the same RC circuit decay time, a lower decay voltage limit when testing two printheads than when testing one printhead allows the detection of at least one possibly shorted printhead with fewer false short indications than using conventional two printhead short detection methods.

The foregoing description of several methods of the invention, and extensions thereof, has been presented for purposes of illustration. It is not intended to be exhaustive or to limit the invention to the precise procedures and forms disclosed, and obviously many modifications and variations are possible in light of the above teaching. It is intended that the scope of the invention be defined by the claims appended hereto.

What is claimed is:

1. A method for detecting at least one possibly shorted printhead in a printer having first and second printheads in parallel which are supplied a voltage from the output of a voltage source, wherein the method comprises the steps of:

a) obtaining a calibration resistor having a resistance which, when placed in parallel to the voltage source, is equivalent to a predetermined maximum leakage current of a single non-shorted printhead in a quiescent state;

b) disposing the calibration resistor and a capacitance load in parallel across the output of the voltage source to define a first circuit;

c) with the first and second printheads electrically isolated from the first circuit, determining a first decay time for the first-circuit voltage across the capacitance load to reach a second voltage from a first voltage after the voltage source is disconnected from the first circuit;

d) determining a second decay time which is shorter than the first decay time;

d) disposing the first and second printheads and the capacitance load in parallel across the output of the voltage source to define a second circuit;

e) with the calibration resistor electrically isolated from the second circuit and with the first and second printheads in a quiescent state, determining the second-circuit voltage across the capacitance load at the second decay time after the voltage source is disconnected from the second circuit; and g) indicating at least one possibly shorted printhead of the first and second printheads when the second-circuit voltage at the second decay time is less than the second voltage.

2. The method of claim 1, wherein the second decay time is determined to be equal to the decay time for the first circuit voltage to reach the second voltage when the calibration resistor in the first circuit is replaced by a resistor having an equivalent resistance to the resistance of two calibration resistors connected in parallel.

3. The method of claim 1, wherein the second decay time is determined to be in a range extending from 70% to 90% of the first decay time.

4. The method of claim 3, wherein the second decay time is determined to be 80%, plus or minus 2%, of the first decay time.

5. The method of claim 1, wherein the voltage source is a printhead regulator.

6. The method of claim 1 also for detecting when the first printhead is a shorted printhead, and also including when step g) indicates at least one possibly shorted printhead, the steps of:

h) disposing the first printhead and the capacitance load in parallel across the output of the voltage source to define a third circuit;

i) with the calibration resistor and the second printhead electrically isolated from the third circuit and with the first printhead in a quiescent state, determining the third-circuit voltage across the capacitance load at the first decay time after the voltage source is disconnected from the third circuit; and j) indicating that the first printhead is a shorted printhead when the third-circuit voltage at the first decay time is less than the second voltage.

7. The method of claim 6, also for detecting when the second printhead is a shorted printhead, and also including the steps of:

k) disposing the second printhead and the capacitance load in parallel across the output of the voltage source to define a fourth circuit;

l) with the calibration resistor and the first printhead electrically isolated from the fourth circuit and with the second printhead in a quiescent state, determining the fourth-circuit voltage across the capacitance load at the first decay time after the voltage source is disconnected from the fourth circuit; and m) indicating that the second printhead is a shorted printhead when the fourth-circuit voltage at the first decay time is less than the second voltage.

8. The method of claim 1, wherein the second voltage is equal to substantially 36.7% of the first voltage.

9. The method of claim 1, wherein the printer is an inkjet printer, and wherein the first and second printheads are inkjet printheads.

10. A method for detecting at least one possibly shorted printhead in a printer having N printheads in parallel which are supplied a voltage from the output of a voltage source, wherein the method comprises the steps of:

a) obtaining a calibration resistor having a resistance which, when placed in parallel to the voltage source, is equivalent to a predetermined maximum leakage current of a single non-shorted printhead in a quiescent state;

b) disposing the calibration resistor and a capacitance load in parallel across the output of the voltage source to define a first circuit;

c) with the N printheads electrically isolated from the first circuit, determining a first decay time for the first-circuit voltage across the capacitance load to reach a second voltage from a first voltage after the voltage source is disconnected from the first circuit;

d) determining a second decay time which is shorter than the first decay time;

e) disposing the N printheads and the capacitance load in parallel across the output of the voltage source to define a second circuit;

f) with the calibration resistor electrically isolated from the second circuit and with the N printheads in a quiescent state, determining the second-circuit voltage across the capacitance load at the second decay time after the voltage source is disconnected from the second circuit; and g) indicating at least one possibly shorted printhead of the N printheads when the second-circuit voltage at the second decay time is less than the second voltage.

11. A method for detecting at least one possibly shorted printhead in a printer having first and second printheads in parallel which are supplied a voltage from the output of a voltage source, wherein the method comprises the steps of:

a) obtaining a calibration resistor having a resistance which, when placed in parallel to the voltage source, is equivalent to a predetermined maximum leakage current of a single non-shorted printhead in a quiescent state;

b) disposing the calibration resistor and a capacitance load in parallel across the output of the voltage source to define a first circuit;

c) with the first and second printheads electrically isolated from the first circuit, determining a first decay time for the first-circuit voltage across the capacitance load to reach a second voltage from a first voltage after the voltage source is disconnected from the first circuit;

d) determining a third voltage which is less than the second voltage;

e) disposing the first and second printheads and the capacitance load in parallel across the output of the voltage source to define a second circuit;

f) with the calibration resistor electrically isolated from the second circuit and with the first and second printheads in a quiescent state, determining the second-circuit voltage across the capacitance load at the first decay time after the voltage source is disconnected from the second circuit; and g) indicating at least one possibly shorted printhead of the first and second printheads when the second-circuit voltage at the first decay time is less than the third voltage.

12. The method of claim 11, wherein the third voltage is determined to be equal to the first circuit voltage at the first decay time when the calibration resistor in the first circuit is replaced by a resistor having an equivalent resistance to the resistance of two calibration resistors connected in parallel.

13. The method of claim 11, wherein the third voltage is determined to be in a range extending from 70% to 90% of the first voltage.

14. The method of claim 13, wherein the third voltage is determined to be 80%, plus or minus 2%, of the first voltage.

15. The method of claim 11, wherein the voltage source is a printhead regulator.

16. The method of claim 11 also for detecting when the first printhead is a shorted printhead, and also including when step g) indicates at least one possibly shorted printhead, the steps of:

h) disposing the first printhead and the capacitance load in parallel across the output of the voltage source to define a third circuit;

i) with the calibration resistor and the second printhead electrically isolated from the third circuit and with the first printhead in a quiescent state, determining the third-circuit voltage across the capacitance load at the first decay time after the voltage source is disconnected from the third circuit; and j) indicating that the first printhead is a shorted printhead when the third-circuit voltage at the first decay time is less than the second voltage.

17. The method of claim 16, also for detecting when the second printhead is a shorted printhead, and also including the steps of:

k) disposing the second printhead and the capacitance load in parallel across the output of the voltage source to define a fourth circuit;

l) with the calibration resistor and the first printhead electrically isolated from the fourth circuit and with the second printhead in a quiescent state, determining the fourth-circuit voltage across the capacitance load at the first decay time after the voltage source is disconnected from the fourth circuit; and m) indicating that the second printhead is a shorted printhead when the fourth-circuit voltage at the first decay time is less than the second voltage.

18. The method of claim 11, wherein the second voltage is equal to substantially 36.7% of the first voltage.

19. The method of claim 11, wherein the printer is an inkjet printer, and wherein the first and second printheads are inkjet printheads.

20. A method for detecting at least one possibly shorted printhead in a printer having N printheads in parallel which are supplied a voltage from the output of a voltage source, wherein the method comprises the steps of:

a) obtaining a calibration resistor having a resistance which, when placed in parallel to the voltage source, is equivalent to a predetermined maximum leakage current of a single non-shorted printhead in a quiescent state;

b) disposing the calibration resistor and a capacitance load in parallel across the output of the voltage source to define a first circuit;

c) with the N printheads electrically isolated from the first circuit, determining a first decay time for the first-circuit voltage across the capacitance load to reach a second voltage from the a voltage after the voltage source is disconnected from the first circuit;

d) determining a third voltage which is less than the second voltage;

e) disposing the N printheads and the capacitance load in parallel across the output of the voltage source to define a second circuit;

f) with the calibration resistor electrically isolated from the second circuit and with the N printheads in a quiescent state, determining the second-circuit voltage across the capacitance load at the first decay time after the voltage source is disconnected from the second circuit; and g) indicating at least one possibly shorted printhead of the N printheads when the second-circuit voltage at the first decay time is less than the third voltage.

* * * * *